(12) United States Patent
Toshishige et al.

(10) Patent No.: US 12,550,746 B2
(45) Date of Patent: Feb. 10, 2026

(54) SUBSTRATE AND METHOD OF MANUFACTURING SUBSTRATE

(71) Applicant: CANON KABUSHIKI KAISHA, Tokyo (JP)

(72) Inventors: Mitsunori Toshishige, Kanagawa (JP); Yoshiyuki Fukumoto, Kanagawa (JP)

(73) Assignee: Canon Kabishiki Kaisha, Tokyo (JP)

( * ) Notice: Subject to any disclaimer, the term of this patent is extended or adjusted under 35 U.S.C. 154(b) by 739 days.

(21) Appl. No.: 17/857,332

(22) Filed: Jul. 5, 2022

(65) Prior Publication Data

US 2023/0008405 A1  Jan. 12, 2023

(30) Foreign Application Priority Data

Jul. 12, 2021 (JP) .................................. 2021-114950
Jun. 10, 2022 (JP) .................................. 2022-094250

(51) Int. Cl.
*H01L 23/544* (2006.01)

(52) U.S. Cl.
CPC .. *H01L 23/544* (2013.01); *H01L 2223/54426* (2013.01)

(58) Field of Classification Search
CPC ..................... H01L 23/544; H01L 2223/54426
See application file for complete search history.

(56) References Cited

U.S. PATENT DOCUMENTS

| 6,752,489 B2 | 6/2004 | Ohashi et al. |
| 7,337,540 B2 | 3/2008 | Kurosawa |
| 2020/0243366 A1* | 7/2020 | Seddon .................. H01L 21/78 |

FOREIGN PATENT DOCUMENTS

| JP | 4-78538 A | 3/1992 |
| JP | 6-5483 A | 1/1994 |
| JP | 11-74174 A | 3/1999 |
| JP | 2000-343693 A | 12/2000 |
| JP | 2002-166553 A | 6/2002 |
| JP | 2003-11365 A | 1/2003 |
| JP | 2003-151870 A | 5/2003 |
| JP | 2005-144622 A | 6/2005 |
| JP | 2011-203325 A | 10/2011 |
| JP | 2016-157772 A | 9/2016 |
| JP | 2019-64272 A | 4/2019 |
| JP | 2020-112766 A | 7/2020 |

* cited by examiner

*Primary Examiner* — Walter H Swanson
(74) *Attorney, Agent, or Firm* — Venable LLP

(57) ABSTRACT

Provided is a method of manufacturing a substrate including an alignment mark, including: forming the alignment mark and a recess portion on the substrate, the alignment mark not penetrating the substrate and including a bottom portion with a lower infrared transmittance than that of a first surface and a second surface of the substrate; and aligning the substrate by orthogonally arranging predetermined positions of the first surface and the second surface of the substrate in a horizontal direction and an infrared ray camera and by image-identifying the alignment mark formed on the substrate with transmitted light of infrared rays emitted from the infrared ray camera.

13 Claims, 14 Drawing Sheets

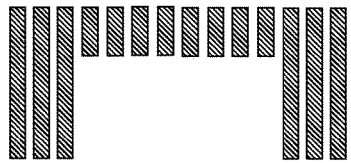 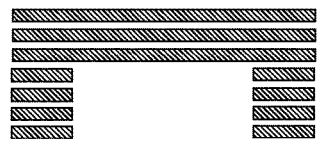 
FIG.11A     FIG.11B     FIG.11C
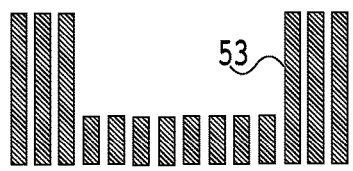 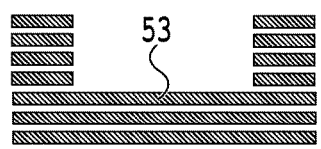 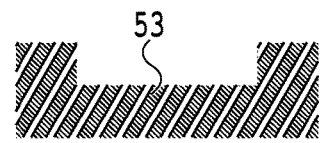
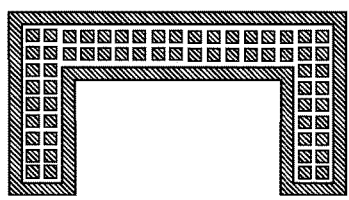 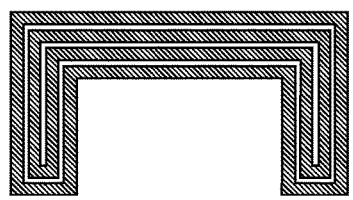 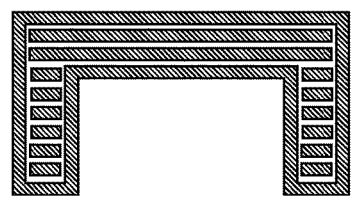
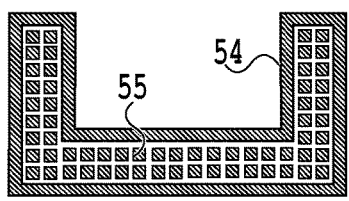 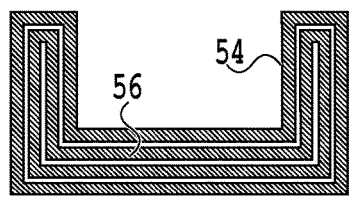 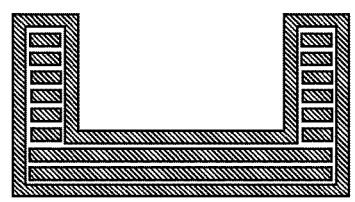
FIG.11D     FIG.11E     FIG.11F

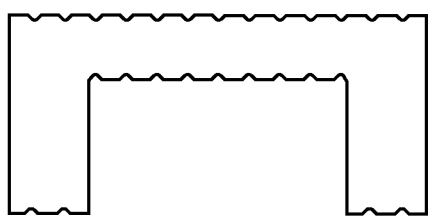
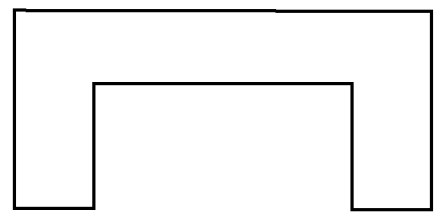
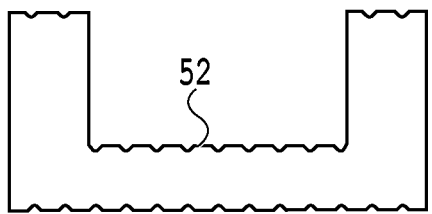
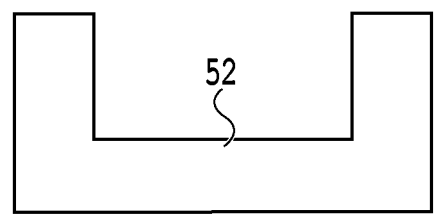
FIG.12A  FIG.12B

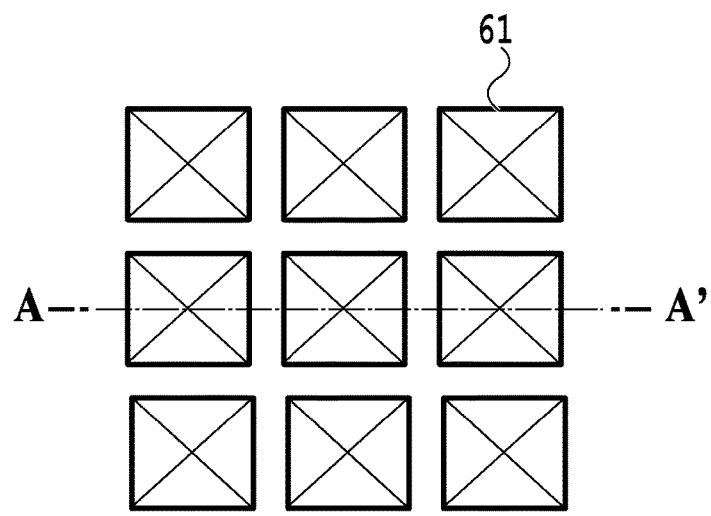
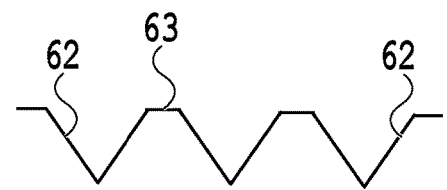
FIG.13A  FIG.13B
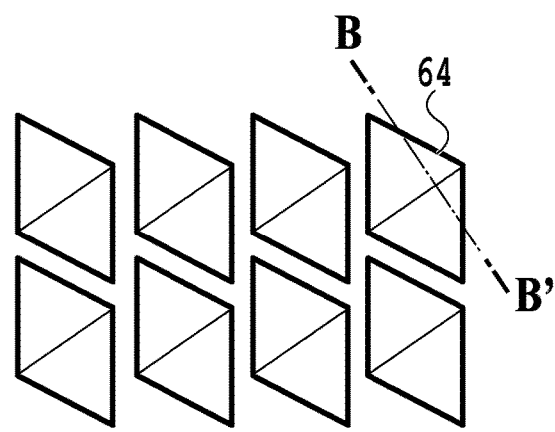
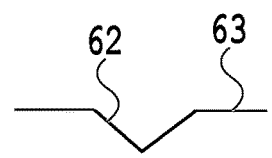
FIG.13C  FIG.13D

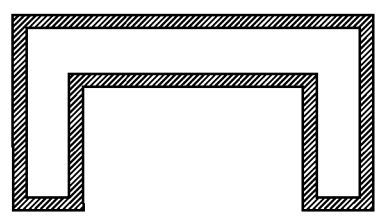
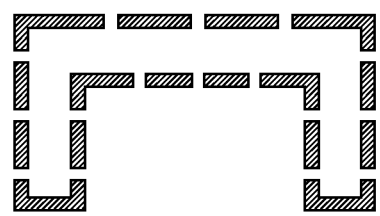
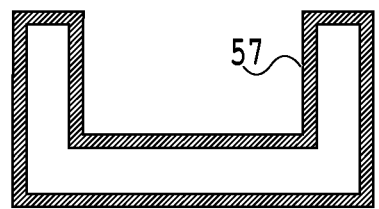
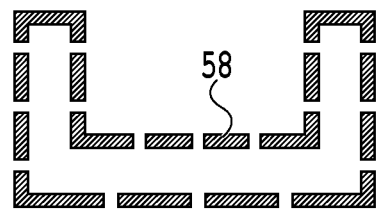
FIG.14A  FIG.14B

SUBSTRATE AND METHOD OF MANUFACTURING SUBSTRATE

BACKGROUND OF THE INVENTION

Field of the Invention

The present invention relates to a substrate and a method of manufacturing the substrate.

Description of the Related Art

A technique of aligning a substrate based on alignment marks formed on the substrate has been used in various fields. In Japanese Patent Laid-Open No. 2019-64272 (hereinafter, referred to as PTL 1), a metal that does not transmit infrared rays is used as a material of the alignment mark. Thus, it is possible to align a substrate by forming an alignment mark of a metallic layer on a silicon substrate and identifying the alignment mark with transmitted light of infrared rays.

SUMMARY OF THE INVENTION

However, the method described in PTL 1 requires a process of forming a metallic layer on the substrate and thereafter patterning the metallic layer into a shape of the alignment mark. Additionally, if all the alignment marks are formed of metal, the number of steps is increased.

The present invention is a method of manufacturing a substrate including an alignment mark: the method including forming the alignment mark and a recess portion on the substrate, the alignment mark not penetrating the substrate and including a bottom portion with a lower infrared transmittance than that of a first surface and a second surface of the substrate; and aligning the substrate by orthogonally arranging predetermined positions of the first surface and the second surface of the substrate in a horizontal direction and an infrared ray camera and by image-identifying the alignment mark formed on the substrate with transmitted light of infrared rays emitted from the infrared ray camera.

Further features of the present invention will become apparent from the following description of exemplary embodiments with reference to the attached drawings.

BRIEF DESCRIPTION OF THE DRAWINGS

FIGS. 11A to 11F are examples of a plan view of the alignment mark;

FIGS. 12A and 12B are examples of a plan view of the alignment mark;

FIGS. 13A to 13D are examples of a plan view and a cross-sectional view of the alignment mark; and FIGS. 14A and 14B are examples of a plan view of the alignment mark.

DESCRIPTION OF THE EMBODIMENTS

Some embodiments of the present invention are described below with reference to the drawings. Note that, the following descriptions are not intended to limit the scope of the present invention.

A substrate including an alignment mark that is described in the present embodiment is described as an example to be applied to a liquid ejection head employing various liquid ejecting methods including the thermal method, the piezoelectric method, and so on; however, it is not limited thereto.

As described above, in a case where the alignment mark is formed of a metallic layer, the number of steps is increased. On the other hand, in order to omit the process of forming the metallic layer, it is required to pattern the shape of the alignment mark on the substrate itself. However, even if the alignment mark is formed on a material that transmits infrared rays like a silicon substrate, there is a risk that the alignment mark cannot be identified with transmitted light of the infrared rays. Therefore, in the following embodiments, there is described a method of manufacturing a substrate including an alignment mark that is identifiable with transmitted light of infrared rays even if the alignment mark is formed on the substrate itself that transmits the infrared rays.

First Embodiment

Figure 1:
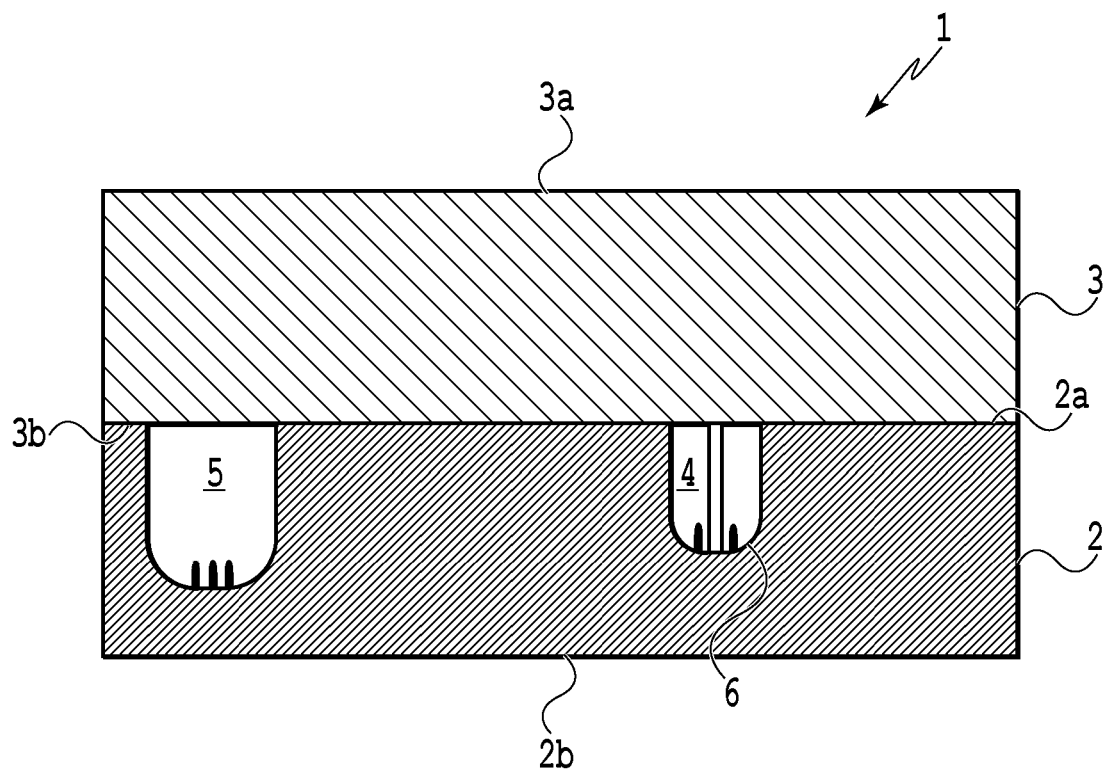
FIG. 1 is a schematic cross-sectional view of a substrate including an alignment mark.

FIG. 1 illustrates a schematic cross-sectional view of a substrate 1 including an alignment mark in the present embodiment. In other words, the substrate 1 is a substrate including an alignment mark that is manufactured in the present embodiment.

As illustrated in FIG. 1, the substrate 1 including the alignment mark includes a first substrate 2 and a second substrate 3 that is bonded to the first substrate 2 using an adhesive. On the first substrate 2, an alignment mark 4 and a recess portion 5 that do not penetrate the first substrate 2 are formed. The recess portion 5 may function as a liquid supply channel. For example, a second surface 2b side of the first substrate 2 may be thinned such that the recess portion 5 penetrates the first substrate 2 so as to process a liquid supply channel that penetrates the first substrate 2. A liquid ejection port that communicates with the recess portion 5 may be formed in a second surface 2b of the first substrate 2. In other words, the recess portion 5 is a recess that is formed to penetrate or not to penetrate through the first substrate 2.

<Alignment Mark>

Figure 2:
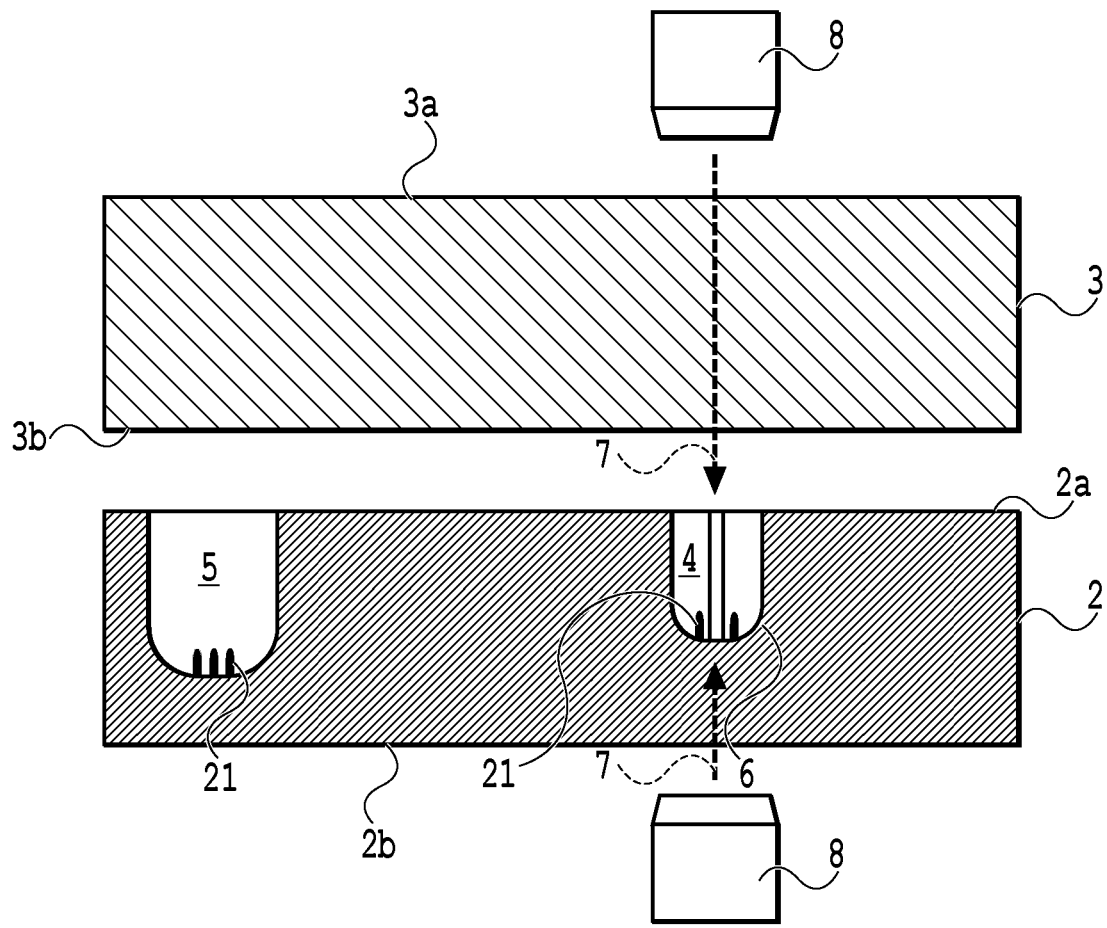
FIG. 2 is a schematic cross-sectional view in a case of alignment.

FIG. 2 illustrates a schematic cross-sectional view in a case of the alignment of the first substrate 2 in the present embodiment. As illustrated in FIG. 2, the first substrate 2 is aligned by image-identification of the alignment mark 4 with transmitted light 7 of infrared rays emitted from an infrared ray camera 8 disposed either above or below the first substrate 2. The material of the first substrate 2 and the second substrate 3 is favorably a silicon substrate in terms of workability; however, any other material may be applied as long as the material allows for the identification of the alignment mark 4 with the transmission of the transmitted light 7 of infrared rays through the substrate. It is possible to facilitate the identification of the alignment mark 4 by making a predetermined portion of each of a first surface 2a of the first substrate 2, the second surface 2b of the first substrate 2, a first surface 3a of the second substrate 3, and a second surface 3b of the second substrate 3 as a mirror surface that facilitates the transmission of the transmitted light 7 of infrared rays. In each surface of the substrates, a portion out of the range of movement of the infrared ray camera 8 in a horizontal direction does not need to be a mirror surface since the portion is not captured by the infrared ray camera 8. In other words, the above-described predetermined portion is a portion that is within the range of movement of the infrared ray camera 8 in the horizontal direction in each surface of the substrates.

The shape of an opening of the alignment mark 4 may be any shape that is identifiable as the alignment mark such as, for example, a cross, a V-shape, a U-shape, a C-shape, a square "C"-shape, a W-shape, an E-shape, a square, a polygon, a parallelogram, or a circle. As illustrated in FIG. 2, since the alignment mark 4 needs to be within the first substrate 2 as a target of the alignment, the alignment mark 4 is formed at a position in depth to the extent that the alignment mark 4 does not penetrate the first substrate 2. It is preferred that a bottom portion 6 of the alignment mark 4 has a characteristic shape. With the characteristic shape, in a case where the first surface 2a and the second surface 2b of the first substrate 2 and the infrared ray camera 8 are arranged orthogonally, the infrared transmittance of the bottom portion 6 is lower than the infrared transmittance of the first surface 2a and the second surface 2b of the first substrate 2. Therefore, it is possible to increase the contrast of the alignment mark 4 and to facilitate the image-identification of the alignment mark 4 with the transmitted light 7 of infrared rays. It is preferred that the infrared transmittance of the bottom portion 6 having the characteristic shape in a case where the first surface 2a and the second surface 2b of the first substrate 2 and the infrared ray camera 8 are arranged orthogonally is equal to or less than a half of the infrared transmittance of the first surface 2a and the second surface 2b of the first substrate 2.

The bottom portion 6 may have any shape as long as it is possible to reduce the transmittance of the infrared rays. For example, the characteristic shape that can reduce the transmittance of the infrared rays may include a shape such as a curved surface, an inclined surface, or a rough surface. In a case of a curved surface, assuming that an opening width of the alignment mark 4 is a chord length, it is preferred that the curved surface has a sagitta of the curved surface that is six percent or more of the chord length. In a case of an inclined surface, assuming that the first surface 2a of the first substrate 2 is a surface at an angle of 0°, it is preferred that the bottom surface of the bottom portion 6 is inclined at 3° or more and less than 90° from the first surface 2a to the second surface 2b of the first substrate 2. In this case, the direction of the inclined surface with respect to the first surface 2a of the first substrate 2 may be inclined in one direction from the first surface 2a to the second surface 2b or may be inclined into a V-shape from the first surface 2a to the second surface 2b. The inclined surface may be inclined to follow the crystal orientation of the silicon substrate. In a case of a rough surface, it is preferred that it is a rough surface in which an arithmetic average surface roughness of the bottom surface of the bottom portion 6 is 1 μm or more. In order to facilitate the image identification of the alignment mark 4, the bottom portion 6 may include a protrusion 21. The protrusion 21 is described in an embodiment described later.

FIGS. 3A to 3D illustrate a schematic plan views of the first substrate 2. The alignment mark 4 and the recess portion 5 can be formed by dry etching, which is a technique of processing a surface of silicon with gas. In terms of omitting a process, it is preferred that the alignment mark 4 formed on the first substrate 2 is formed with the recess portion 5 concurrently by dry etching, for example.

Figure 3B:
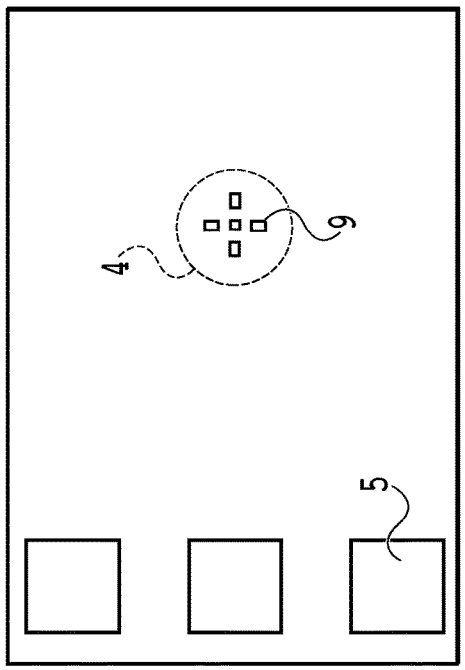
FIGS. 3A to 3D are schematic plan views of the substrate.
Figure 3D:
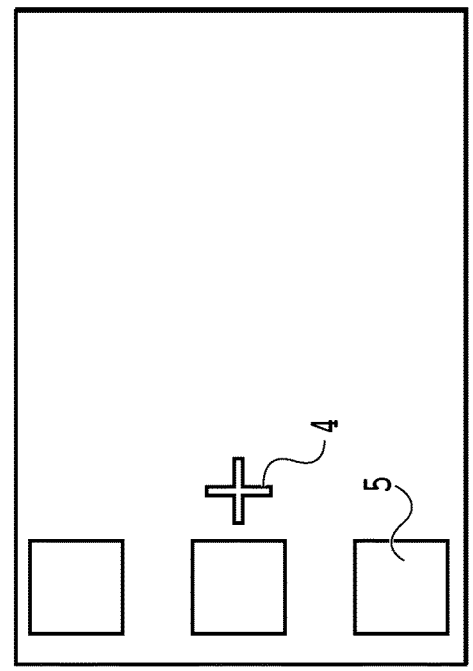
Figure 3A:
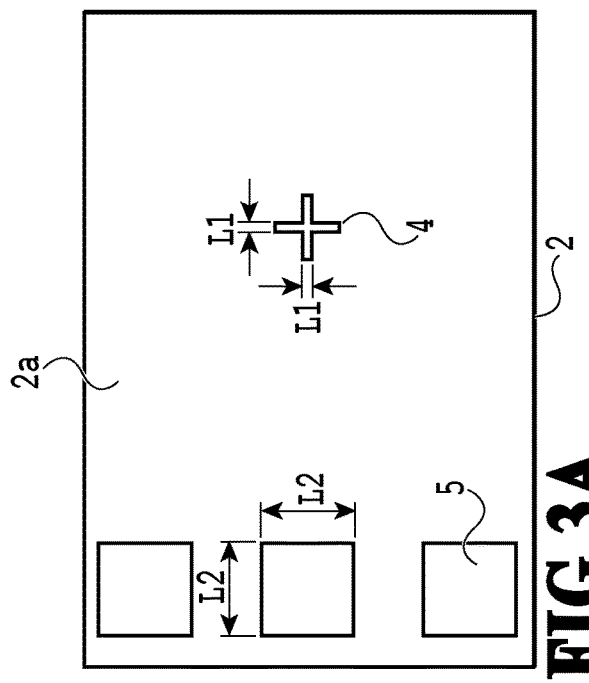

As illustrated in FIG. 3A, in a case where the alignment mark 4 and the recess portion 5 are formed together on the first substrate 2 concurrently by dry etching, it is preferred that an opening width L1 of the alignment mark 4 is narrower than an opening width L2 of the recess portion 5. With this, the micro-loading effect can be expected. The micro-loading effect is a reduction in the etching rate (speed of etching) due to the difficulty in entering of ion components and radical components contributing the etching into an opening pattern along with a reduction in an opening width of a pattern. With the reduction in the etching rate of the opening width L1, the alignment mark 4 is formed at a position shallower than the recess portion 5, and it is possible to suppress the penetration of the alignment mark 4. Additionally, it is possible to concurrently form the alignment mark 4 and the recess portion 5. In order to form the alignment mark 4 at a position definitely shallower than the recess portion 5, it is preferred that the opening width L2 of the recess portion 5 is a quintuple or more of the opening width L1 of the alignment mark 4.

<Modification of First Embodiment>

Figure 3C:
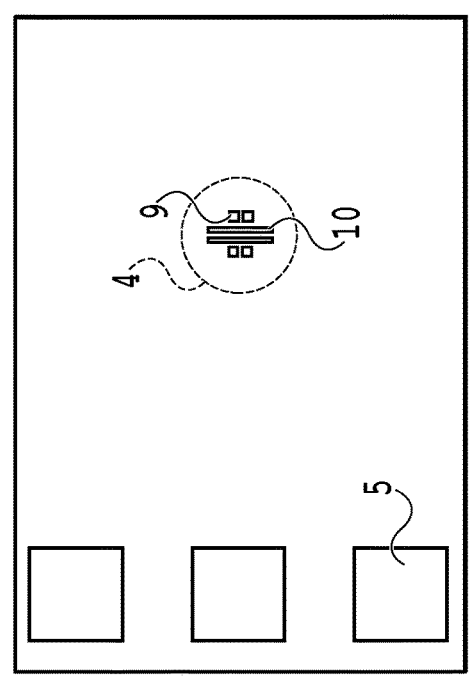

FIGS. 3B and 3C each illustrate a schematic plan view of the first substrate 2 in a case where the shape of the alignment mark 4 in the present embodiment is deformed. In FIG. 3B, the alignment mark 4 is formed as an aggregate of multiple holes 9. Therefore, in a case where the alignment mark 4 and the recess portion 5 are formed together on the first substrate 2 concurrently by dry etching, the micro-loading effect can be expected by forming the alignment mark 4 by dividing into multiple holes 9 having a narrow opening width. Since the opening width of the alignment mark 4 in FIG. 3B is narrower than that in FIG. 3A, it is possible to make the depth of the alignment mark 4 shallower, and the concurrent formation of the alignment mark 4 and the recess portion 5 is facilitated. The opening shape of each hole 9 may be a shape either of, for example, a square, a rectangular, a polygon, a parallelogram, a circle, and the like since the opening shape may be any shape as long as the micro-loading effect can be expected and the shape is identifiable as the alignment mark. As an example, as illustrated in FIG. 3C, the alignment mark 4 may be formed of the aggregate of multiple holes 9 and a linear opening portion 10.

Here, a modification of arrangement of the alignment mark 4 different from FIGS. 3B and 3C described above is illustrated in FIG. 3D.

FIG. 3D illustrates a schematic plan view of the first substrate 2 in a case where the position of the alignment mark 4 is arranged close to the recess portion 5. With such arrangement, there can be expected the loading effect due to a reduction in the etching rate of the alignment mark 4 because the radical components contributing the etching are consumed by etching of the recess portion 5 close to the alignment mark 4. Therefore, it is possible to form the alignment mark 4 at a shallower position than that in the mode in FIG. 3A, and thus the concurrent formation of the alignment mark 4 and the recess portion 5 is facilitated.

Second Embodiment

Figure 4:
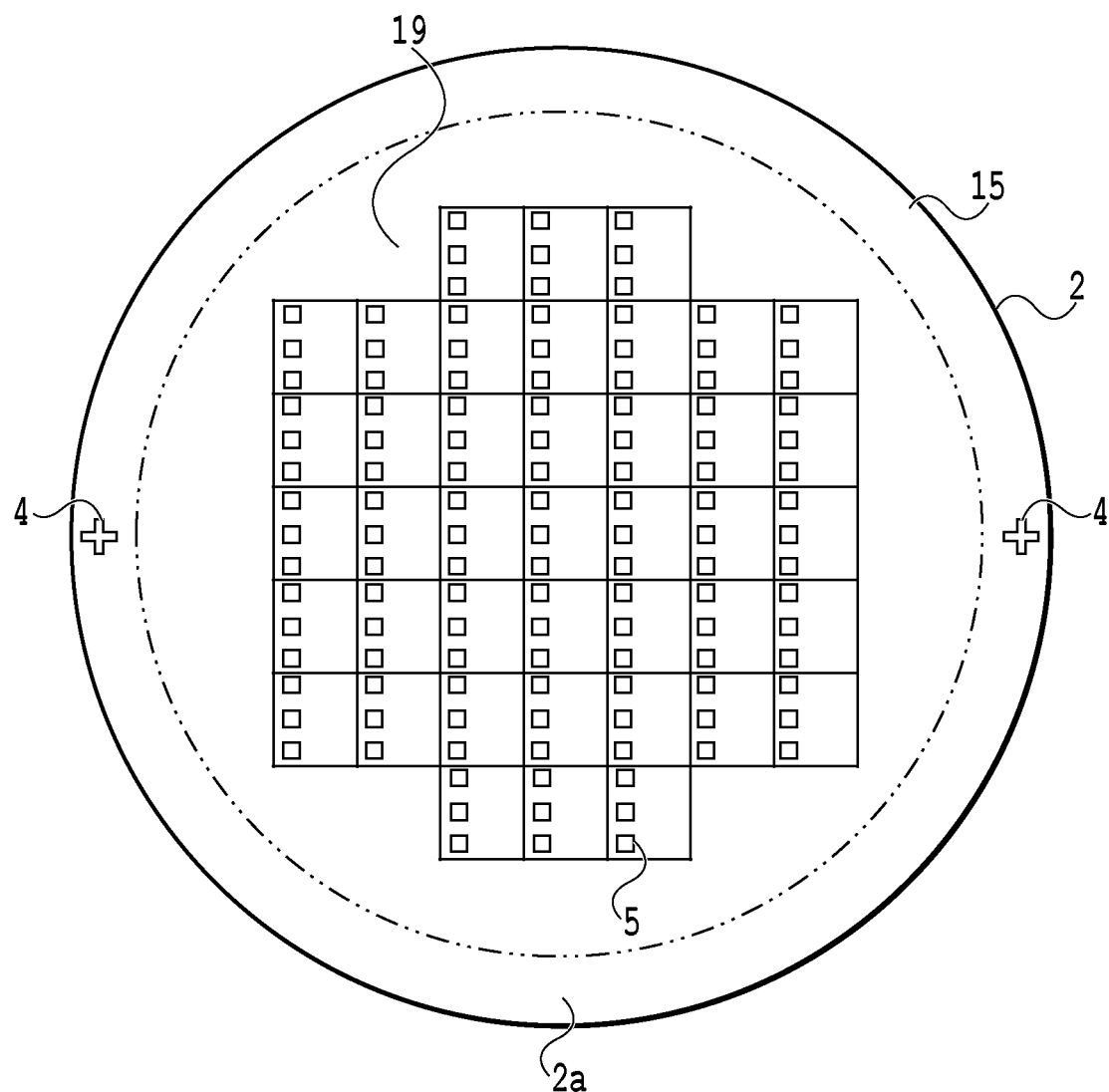
FIG. 4 is a schematic plan view of the substrate.

FIG. 4 illustrates a plan view schematically illustrating the first substrate 2 including an alignment mark in the present embodiment. In the present embodiment, the arrangement positions of the alignment mark 4 and the recess portion 5 are determined in accordance with a difference in distribution of the plasma density in the first substrate 2. In the first substrate 2 in FIG. 4, with a broken line portion as the boundary, the plasma density in a region 15 is low, and the plasma density in a region 19 is high. In such a case, it is preferred that the alignment mark 4 is formed in the region 15 of low plasma density. With the alignment mark 4 being formed in the region 15 of low plasma density, it is possible to reduce the etching rate of the alignment mark 4 and to form the alignment mark 4 at a shallow position. On the other hand, the recess portion 5 is formed in the region 19 of high plasma density. With the recess portion 5 being formed in the region 19 of high plasma density, it is possible to suppress formation of the alignment mark 4 at a deeper position than the recess portion 5, and thus the concurrent formation of the alignment mark 4 and the recess portion 5 is facilitated. As a result, the alignment mark 4 in the present embodiment is provided close to the outermost periphery of the first substrate 2. If the region 15 of low plasma density is close to the center of the first substrate 2, the alignment mark 4 may be provided close to the substrate center of the first substrate 2.

Third Embodiment

Figure 5:
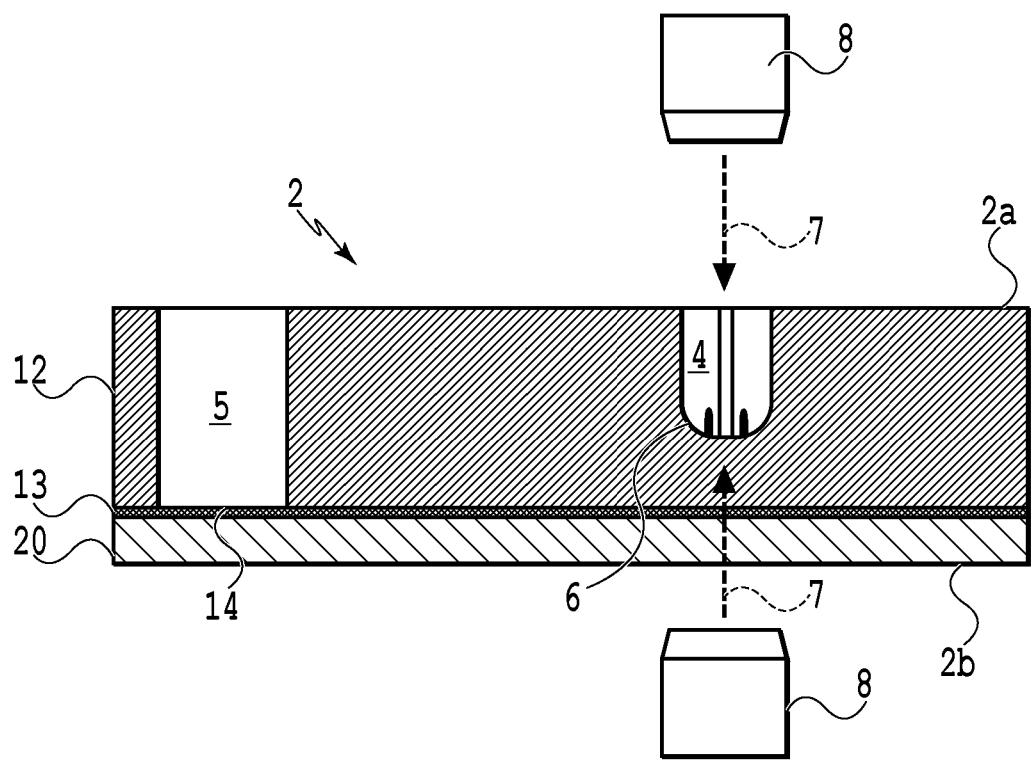
FIG. 5 is a schematic cross-sectional view of the substrate.

FIG. 5 illustrates a schematic cross-sectional view of the first substrate 2 in the present embodiment. The first substrate 2 in the present embodiment is not a substrate of a single silicon layer but is a silicon on insulator (SOI) substrate in which a first silicon layer 12, an oxidized silicon layer 13, and a second silicon layer 20 are laminated. In the first substrate 2, the recess portion 5 and the alignment mark 4 that does not penetrate the first substrate 2 are formed concurrently by dry etching. The bottom surface of the recess portion 5 is a smooth bottom surface 14 from which the oxidized layer 13 is exposed. The reason the bottom surface of the recess portion 5 is formed as the smooth bottom surface 14 is that there is a merit in a case of using the recess portion 5 as a liquid supply channel that the volume of the liquid supply channel can be increased, for example.

The present embodiment is effective in a case where it is desired to maintain the bottom portion 6 of the alignment mark 4 in the characteristic shape and also to use the bottom surface of the recess portion as the smooth bottom surface 14. However, if the bottom surface of the recess portion 5 is etched until the smooth bottom surface 14 is obtained, the etching time is longer than that in the first embodiment. Therefore, if the opening width of the alignment mark 4 is not narrower than that in the first embodiment, there is a concern that the alignment mark 4 also obtains the smooth bottom surface 14 as the bottom surface or penetrates the first substrate 2. The alignment mark 4 in which the bottom surface is the smooth bottom surface 14 transmits infrared rays; for this reason, the image identification by the transmitted light 7 of infrared rays cannot be performed, and the first substrate 2 cannot be aligned. Also, in a case where the alignment mark 4 penetrates the first substrate 2, the image identification by the transmitted light 7 of infrared rays cannot be performed, and the first substrate 2 cannot be aligned. Therefore, in the present embodiment, it is preferred that the opening width of the alignment mark 4 is narrower than that in a case of applying the first embodiment.

Fourth Embodiment

Figure 6:
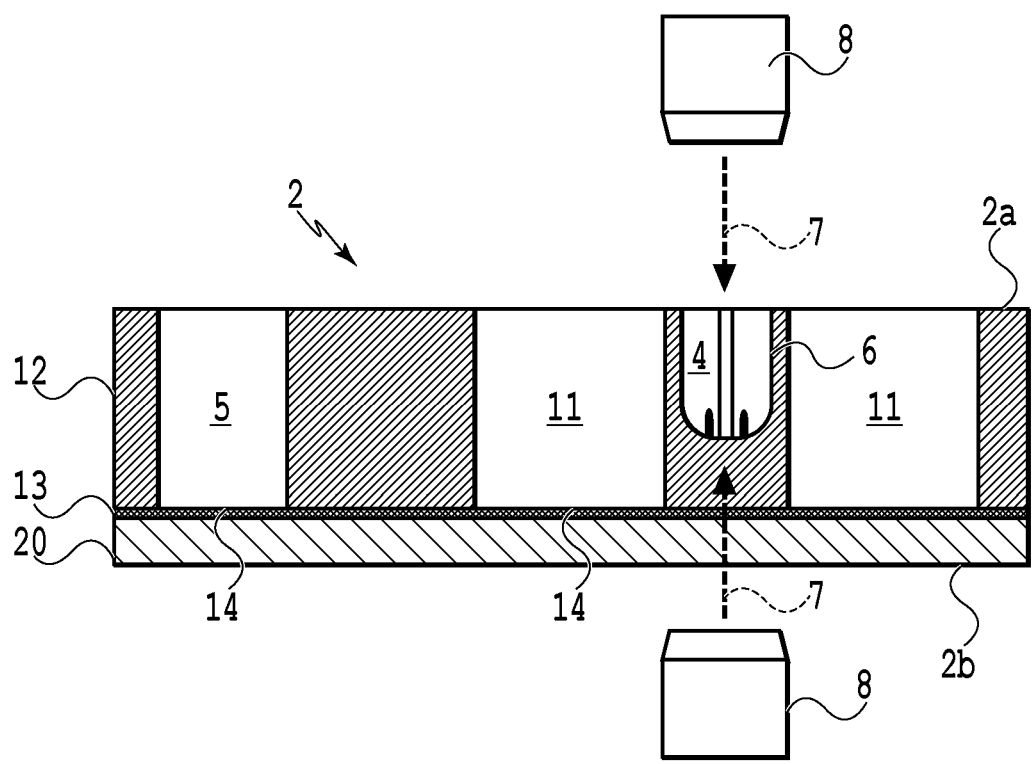
FIG. 6 is a schematic cross-sectional view of the substrate.

FIG. 6 illustrates a schematic cross-sectional view of the first substrate 2 in the present embodiment. The first substrate 2 in the present embodiment is an SOI substrate as with the third embodiment. In the first substrate 2, in addition to the recess portion 5 and the alignment mark 4 formed at a position so as not to penetrate the first substrate 2, a groove portion 11 in a frame shape is formed. The bottom surfaces of the recess portion 5 and the groove portion 11 in a frame shape is the smooth bottom surface 14 from which the oxidized layer 13 is exposed. The groove portion 11 in a frame shape, the alignment mark 4, and the recess portion 5 are formed concurrently by dry etching. Therefore, there can be expected the loading effect in which the etching rate of the alignment mark 4 is reduced because the radical components contributing the etching are consumed by etching of the groove portion 11 in a frame shape close to the alignment mark 4. Therefore, the concurrent formation of the alignment mark 4 and the recess portion 5 is facilitated.

Figure 7:
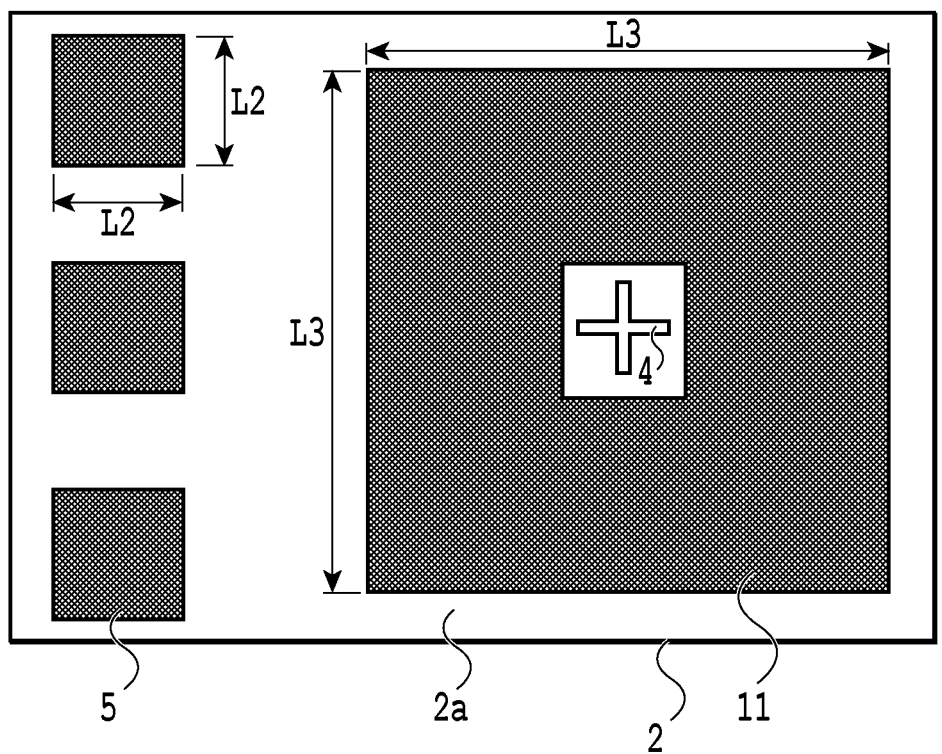
FIG. 7 is a schematic plan view of the substrate.

FIG. 7 illustrates a schematic plan view of the first substrate 2 in the present embodiment. As illustrated in FIG. 6, the etching of the groove portion 11 in a frame shape can be stopped at the oxidized layer 13. Therefore, as illustrated in FIG. 7, it is possible to make an opening width L3 of the groove portion 11 in a frame shape wider than the opening width L2 of the recess portion 5, and it is possible to suppress formation of the recess portion 5 at a deeper position than the groove portion 11 in a frame shape. With the opening width L3 of the groove portion 11 in a frame shape being made wider, it is possible to make the depth of the alignment mark 4 shallower than that in the third embodiment due to the above-described loading effect; for this reason, the concurrent formation of the alignment mark 4 and the recess portion 5 is facilitated. The shape of the groove portion 11 in a frame shape may be a shape either of a circle in a frame shape, a square in a frame shape, a rectangular in a frame shape, a polygon in a frame shape, and a parallelogram in a frame shape that surround the alignment mark 4 since the shape of the groove portion 11 in a frame shape may be any shape as long as the loading effect can be expected.

Fifth Embodiment

Figure 10:
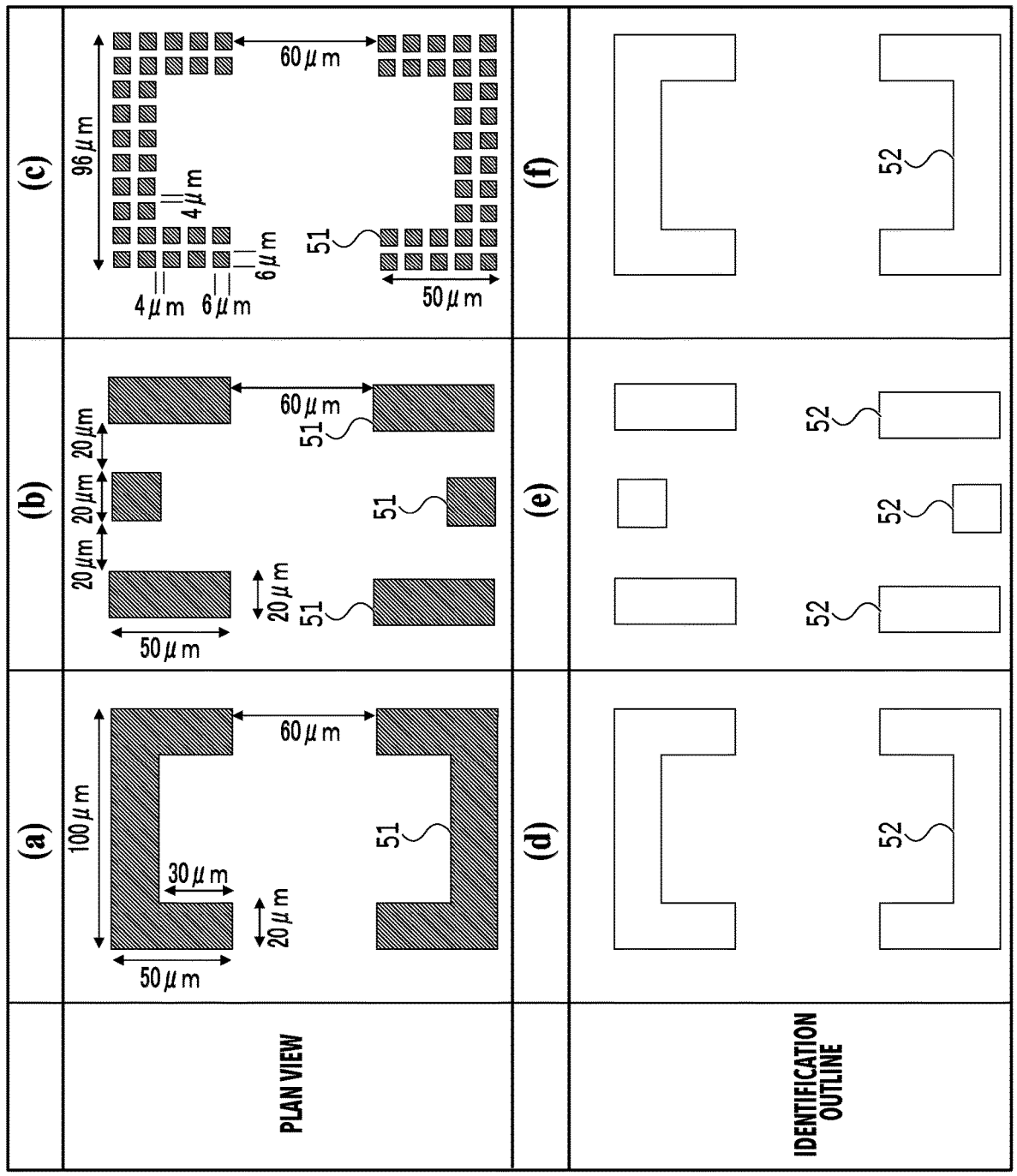
FIG. 10 is an example of a plan view of the alignment mark.

FIG. 10 illustrates an example of a planar shape of the non-penetrating alignment mark processed on the silicon substrate by dry etching and a mark outline shape (identification outline 52) actually identified on alignment software. A dimension measured by an electron beam microscope is also illustrated in FIG. 10. A portion indicated by hatched lines is a non-penetrating hole 51 processed by dry etching.

FIG. 10*a* includes two square "C"-shaped marks. The hole 51 indicated by hatched lines is shown darker than the background. The mark identification outlines also substantially match the two outer periphery shapes of the marks.

FIG. 10*b* is a shape obtained by modifying the marks illustrated in FIG. 10*a* so as to make a dry etching depth shallow and further prevent the penetration into the substrate. Comparing with FIG. 10*a*, the square "C"-shaped portion is divided into three, and the divided parts are separated from each other. FIG. 10*d* illustrates the mark identification outline corresponding to FIG. 10*a*. As illustrated in FIG. 10*b*, it can be seen that the identification outline 52 corresponding to FIG. 10*a* is also an outer periphery shape of a portion that is divided into small pieces.

In FIG. 10*b*, there is a merit that the depth of the mark can be made shallow; however, each portion in the mark is small because it is divided into small pieces. Accordingly, as illustrated in FIG. 10e, the mark identification outline corresponding to FIG. 10b is an aggregate of small shapes. Such a mark has a possibility that the identification performance is degraded.

As an example in which the identification performance is degraded, in a case where an adhesive is formed for bonding on any substrate, disturbance is made due to a contrast caused by the roughness on the adhesive surface (waves in a cycle of 10 µm to 500 µm), and thus the identification performance may be reduced. In addition, a void that remains in an adhesive because the roughness of the adhesive is not completely smoothed during the bonding, a fine structure originally existing in the substrate, and the like may be a factor of the disturbance. It can be considered that, as the mark component portion divided into a small piece is smaller, the characteristics thereof are reduced, and therefore the identification performance is degraded.

To deal with this, FIG. 10c illustrates a configuration in which the mark is formed of an aggregate of multiple holes and the aggregate portion formed of the neighbor-most holes is a mark aggregate. Each of the two square "C"-shaped shapes is the mark aggregate of the multiple holes. The multiple holes (outermost side holes) 51 on the outermost side of the mark aggregate extend in one direction in a substrate planar direction. In a case where the multiple holes 51 form a side (outermost side-side) arranged on the outermost side of the mark aggregate, the one direction is, for example, a longitudinal direction of the outermost side-side. The identification outline 52 is a closed curve including multiple outermost side-sides and also including the mark aggregate. In other words, the adjacent outermost side-sides being connected to each other are the outline of the alignment mark. In the example in FIG. 10c, the actual shape is multiple holes; however, as illustrated in FIG. 10f, the identification outline corresponding to FIG. 10c is two large square "C"-shaped shapes as the identification shape.

In FIG. 10c, an interval between the holes 51 of the mark aggregate is designed to be small. In the present embodiment, a mark close to FIG. 10a is formed by spreading the multiple holes 51 having a side of 6 µm width such that the average distance between the holes 51 is 4 µm. Since the average distance between the holes 51 is 4 µm and narrow, on the image sensor identifying the alignment mark, a black portion is spread outside the actual dimension of the hole due to blurring caused by scattering from a hole side wall and a bottom portion.

As a result, although a portion of 4 µm width including no hole is between the nearest adjacent holes 51 (hole interval portion), since the portion looks black on the image, it is possible to identify the aggregate of the holes (square "C"-shaped portion) as a single black mark. Additionally, it is possible to obtain the identification outline 52 of the mark equivalent to that in FIG. 10d.

Next, here is considered a distance of the hole interval that allows for a connection between images of multiple holes without separation with the hole interval portion being covered with blurring caused by scattering from the hole side wall and the bottom portion. If the actual distance of the hole interval is more than 15 the images of the holes are separated from each other. For instance, in FIG. 10b, the actual distance of the hole interval is 20 and the hole is identified as an independent hole.

FIG. 10c includes a fine hole with a width of 6 µm; for this reason, the dry etching depth thereof is likely to be shallower due to the micro-loading effect. Accordingly, the configuration has a merit that the penetration into the substrate is more unlikely to occur. Additionally, it is possible to freely design a large identification outline; for this reason, there is a merit that the mark identification performance can be enhanced. Taking account of the above-described results, it is more preferable that the actual distance of the hole interval is 10 µm or less because it is possible to stably connect the images of the holes. Additionally, even if the actual distance of the hole interval is 15 µm or less, it is still possible to connect the images of the holes to some extent; thus, it can be said it is preferable.

Now, here is considered that two pairs of silicon substrates with a thickness of 625 µm in which the two sides are polished are prepared and the alignment marks of FIGS. 10a to 10c are processed by dry etching so as not to penetrate one of the bonding surfaces. Specifically, benzocyclobutene resin is transferred and formed as an adhesive with a thickness of 2 µm on the surface including the alignment mark, and the other silicon substrate is bonded thereto. As a result of keeping monitoring and measuring the alignment mark with an infrared microscope constantly during the bonding, the mark of FIG. 10b has bad stability in the mark identification before and after the bonding, and a mark central coordinate is unstable, or the mark cannot be detected in some cases. It is estimated that this is because there occurs a disturbance factor (surface roughness of the adhesive and a void generated with a part of the roughness of the adhesive being not smoothed and remaining) that inhibits the mark identification near the alignment mark.

On the other hand, the mark identification of the marks of FIG. 10a and FIG. 10c are constantly stable before and in the middle of the bonding, and central coordinates thereof never move. The identification performance of FIG. 10a is stable because the inside of the mark is colored in black since it is non-penetrating and also the identification outline is large. It is also indicated that a mark formed by arraying many fine holes as illustrated in FIG. 10c can also have the equivalent identification stability.

The mark including the aggregate of the fine holes illustrated in FIG. 10c is also able to be formed of a form other than a dot of a square. FIG. 11 illustrates an example thereof. It is preferable that any marks have a sufficiently small actual distance between adjacent fine holes. Additionally, it is preferable that the actual distance is close to a distance small enough that blurring regions near fine mark end portion are put in contact with each other.

The blurring width may be controlled by adjusting an optical system of the infrared microscope. During the adjustment, it is preferable that an alignment mark observation optical system is set such that the image contrast corresponding to a portion between adjacent holes in an optical image of the alignment mark is out of the range of the alignment mark and is also darker than a background portion including no structure. It is preferable that the blurring width is increased, with the numerical aperture of an infrared lens being set to be small, a working distance from a sensor being slightly displaced from a focal position, or the wavelength of the infrared ray being set to be long. However, there is also a demerit that the stability or the clarity of an image itself is reduced; for this reason, it is preferable to make the adjustment to the extent that the alignment accuracy is maintained.

FIG. 11A includes an aggregate of long groove holes extending in the substrate planar direction, and the long groove holes are arranged in the outline portion of the alignment mark. With the long groove hole, the hole depth is deeper than that of the dot. However, the hole depth is sufficiently shallower than the depth of a liquid supply channel processed by the same etching step; thus, the long groove hole does not penetrate the substrate even if the liquid channel is allowed to penetrate the substrate. The long groove hole is deeper than the dot, and the scattering is likely to occur with an increase in the roughness of the bottom portion; thus, the inside of the mark is colored in black more than the dot. As a result, the visibility of the mark is enhanced, and the identification stability is improved.

As another example, arrangement as illustrated in FIG. 11B in which a long groove extending direction is rotated at 90 degrees with respect to FIG. 11A or arrangement as illustrated in FIG. 11C in which the long groove portion extends obliquely may be applicable. It is not preferable to make the width of a hole 53 (length of the hole in a transverse direction) excessively wide because the etching rate is increased and there is a risk of penetrating the substrate. If the groove is narrow, etching is difficult to proceed. A preferable width may be 0.1 to 10 µm.

In the long grooves of FIG. 11A, once an interval between the adjacent long grooves is increased, a long groove interval portion becomes pale, and the adjacent long grooves are separated from each other on the image. FIG. 12A illustrates the identification outline in this case. Once the separation between the long grooves is advanced, an edge of the long groove interval portion in the identification outline is dented, and the shape stability is slightly reduced.

To deal with this, if the outermost periphery portion of the mark aggregate is processed as a long groove in the form of a continuously closed space as illustrated in FIG. 11D, it is possible to prevent occurrence of a dent in the identification outline. As a result, the identification outline 52 with no dent as illustrated in FIG. 12B is obtained. In FIG. 11D, a mark aggregate outer periphery portion is a continuous groove, and dots are arrayed therein.

If the mark aggregate outer periphery portion is a continuous groove, and multiple grooves on a closed curve are arranged therein as illustrated in FIG. 11E, or multiple long grooves are arrayed therein as illustrated in FIG. 11F, it is preferable because the inside of the mark is further colored in black.

For the cases of FIGS. 11D to 11F, the continuous groove surrounding the outermost periphery portion of the mark aggregate may be partially discontinuous. Multiple portions may be discontinuous. If the groove width is excessively wide, it is not preferable because the etching rate is increased and there is a risk of penetrating the substrate. If the groove is narrow, etching is difficult to proceed. A preferable width may be 0.1 to 10 µm.

It is preferable that the density of the holes of the aggregate of the fine holes (opening area ratio of the fine holes with respect to the whole area of the mark aggregate) is 30 to 50%, because the inside of the mark aggregate is colored in black and it is possible to stably identify the mark. Even if the density of the holes is less than 30 to 50%, it is still possible to identify the mark. In order to obtain the identifiable black contrast, it is preferable that the density of the holes is 10% or more. It is preferable that the density of the aggregate of the fine holes has a higher density as farther from the inside of the mark aggregate. This is because, since a boundary on the outermost side of the mark aggregate is the identification outline, the identification is more stable as the vicinity of the mark outermost side has a higher density and the color is blacker.

Sixth Embodiment

Next, an example of forming the alignment mark by using wet etching is described. With crystal anisotropy wet etching using a strongly alkaline etching liquid being performed on the silicon substrate, since the etching rate is different depending on a crystal plane, various etching hole shapes can be obtained depending on the type of the substrate.

The substrate may be an Si(001) substrate, an Si(110) substrate, an Si(112) substrate, or the like. The wet etching liquid may be potassium hydroxide, tetramethylammonium hydroxide, or the like. It is preferable that the temperature is heated to 40 to 90° C.

Once the mark pattern becomes fine, the (111) plane is exposed in a wide portion inside the mark hole along with etching proceeds. In the (111) plane, the etching rate is slow, and wet etching stops; thus, the shape of a hole cross section is stable.

FIG. 13A illustrates a shape 61 formed by processing using wet etching on an Si(001) substrate. FIG. 13B Illustrates a depth profile of a cross section taken along A-A' in FIG. 13A. In FIG. 13B, a (111) plane 62 is exposed on a mark hole side wall, and thus a stable fine hole is processed. A portion that is not etched is a (001) plane 63.

Many fine holes as described above are processed, and intervals of the many holes are made narrow; thus, as with the fifth embodiment (fine hole aggregate processed by dry etching), it is possible to obtain the identification outline in an arbitrary shape. A preferable method of arranging the holes in the present embodiment is similar to that in the fifth embodiment. Particularly, since the mark shape that can be stabilized is limited if crystal anisotropy wet etching is used, the planar shape of the mark may not be designed freely in some cases. With the mark being formed of the above-described multiple aggregates of fine holes, there is a merit that it is possible to obtain the identification outline in an arbitrary shape.

FIG. 13C illustrates a shape 64 formed by processing using wet etching on the Si(110) substrate. FIG. 13D illustrates a depth profile of a cross section taken along B-B' in FIG. 13C. In FIG. 13D, the (111) plane 62 is similarly exposed on the mark hole side wall, and thus a stable fine hole is processed.

Seventh Embodiment

As another method of decreasing the rate of dry etching of the alignment mark and also increasing the identification outline of the mark, there may be a method of forming the outer periphery portion of the mark with a narrow groove portion.

FIG. 14A illustrates an example thereof. As the mark shape in the square "C"-shape, a groove 57 of a closed space with a narrow width along the mark outline is formed. Since the width of the groove is narrow, the micro-loading effect works, and the dry etching rate is decreased; thus, it is possible to make the groove 57 shallow. A continuous side on the outermost side of the groove 57 becomes the identification outline, and it is possible to obtain the identification outline in an arbitrary size and arbitrary shape. Accordingly, it is possible to control the shape arbitrarily while making the groove shallow.

If the groove width of the groove 57 is excessively wide, it is not preferable because the etching rate is increased and there is a risk of penetrating the substrate. If the groove is narrow, etching is difficult to proceed. A preferable width may be 0.1 to 10 µm.

Additionally, a part of the outline of the mark may be formed of a groove as illustrated in FIG. 14B. The mark includes multiple grooves 58 in which the identification outline is not a closed space. With this, it is possible to shorten the length of the groove, and there is a merit of decreasing the etching rate. It is preferable that an interval between the multiple grooves is narrow, and it is possible to set at an inter-groove distance equivalent to that in the fifth embodiment.

<First Manufacturing Method>

FIGS. 8A to 8H are cross-sectional views illustrating a method of manufacturing the substrate 1 viewed in the same direction as that in FIG. 1. A first method of manufacturing the substrate 1 including an alignment mark is described with reference to FIGS. 8A to 8H.

Figure 8A:
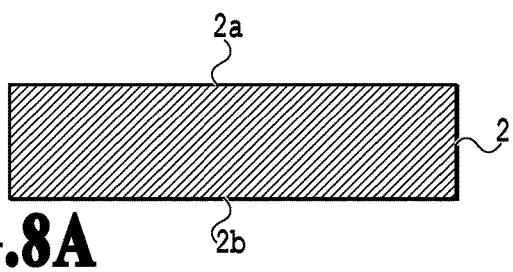
FIGS. 8A to 8H are schematic cross-sectional views illustrating a method of manufacturing the substrate.
Figure 8B:
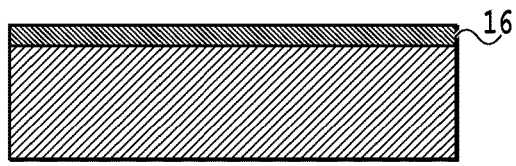

First, as illustrated in FIG. 8A, as the first substrate 2, a silicon substrate with a thickness of about 725 μm and a diameter of about 200 mm is prepared. The first surface 2a of the first substrate 2 and the second surface 2b of the first substrate 2 are mirror surfaces. Next, as illustrated in FIG. 8B, a resist layer 16 is formed by applying a positive resist to the first surface 2a of the first substrate 2 by a spin coat method and then performing baking.

Figure 8C:
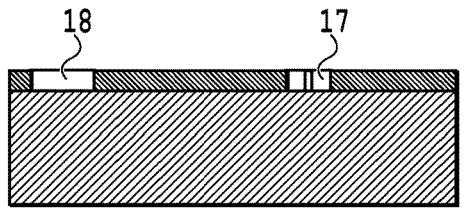

Next, as illustrated in FIG. 8C, by photolithography, a pattern 17 for processing an alignment mark in a cross-shape having an opening width of about 10 μm and a pattern 18 for processing a recess portion having an opening width of about 100 μm are formed on the resist layer 16. The opening width of the pattern 17 for processing an alignment mark is narrower than the opening width of the pattern 18 for processing a recess portion; for this reason, in a dry etching step described later, it is possible to reduce the etching rate of the alignment mark 4 comparing with the etching rate of the recess portion 5. Additionally, it is possible to form the alignment mark 4 at a shallower position than the recess portion 5.

Figure 8G:
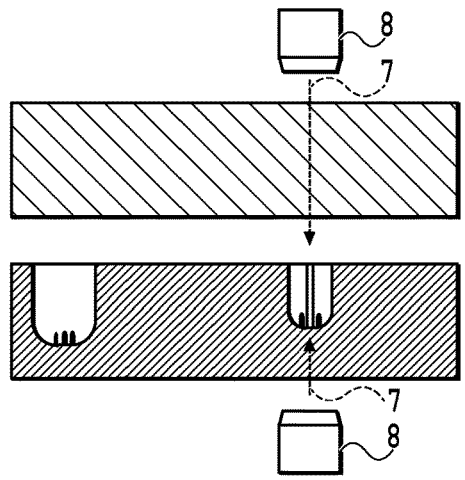
Figure 8D:
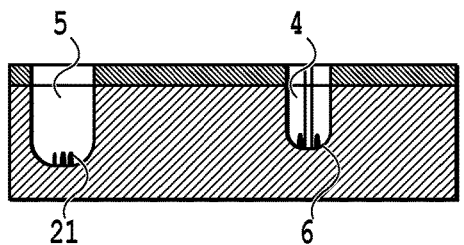

Next, as illustrated in FIG. 8D, the alignment mark 4 and the recess portion 5 are formed on the first substrate 2 concurrently by the Bosch process using reactive ion etching that is a kind of dry etching. The Bosch process is a method of anisotropically etching silicon by alternately repeating formation of a protective film (not illustrated) including carbon as a main component and etching by $SF_6$ gas and the like. In order to etch the alignment mark 4 and the recess portion 5, $SF_6$ gas is used. In order to form the protective film on side surfaces of the alignment mark 4 and the recess portion 5, $C_4F_8$ gas is used.

In a case of the present embodiment, in order to facilitate the image identification of the alignment mark 4 with the transmitted light 7 of infrared rays, it is preferred that the dry etching is performed under the conditions that the silicon protrusion 21 is easily generated on the bottom portion 6 and the bottom portion 6 is likely to be a curved surface. The protrusion 21 is formed with the following steps: silicon is etched; the protective film remains partially on the bottom portion 6; the protective film serves as an etching mask; and the silicon remains. With the protrusion 21 being generated, the image identification using the transmitted light 7 of infrared rays is facilitated. In the present embodiment, in order to set the conditions under which the silicon protrusion 21 is likely to be generated on the bottom portion 6, it is preferred to put priority on the formation of the protective film by reducing a flow rate of $SF_6$ gas. Additionally, in order to set the conditions under which the bottom portion 6 is likely to be a curved surface, it is preferred to put priority on isotropy by reducing output of bias that serves to put priority on anisotropy by attracting ion. In this case, the bottom portion 6 has a characteristic shape including the silicon protrusion 21 and a curved surface. It is preferred to form the alignment mark 4 so as not to penetrate the first substrate 2 to keep the infrared transmittance low.

The depth of the formed alignment mark 4 is about 400 μm, and the depth of the formed recess portion 5 is about 600 μm. In the present embodiment, the bottom portion 6 of the alignment mark 4 is formed to include the silicon protrusion 21 and a curved surface; however, the shape of the bottom portion 6 is not limited thereto. Additionally, although reactive ion etching is used in the present embodiment, the alignment mark 4 may be formed by using chemical etching, wet etching, laser processing, or sandblasting. The silicon protrusion 21 formed in the recess portion 5 is unnecessary in the present embodiment; for this reason, the silicon protrusion 21 may be removed after the alignment mark 4 and the recess portion 5 are processed by dry etching.

Figure 8E:
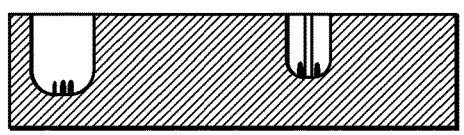

Next, as illustrated in FIG. 8E, after the protective film in the Bosch process is removed by hydrofluoroether, the resist layer 16 is removed by using an alkaline stripping solution. Next, as illustrated in FIG. 8F, as the second substrate 3, a silicon substrate with a thickness of about 725 μm and a diameter of about 200 mm is prepared. The first surface 3a of the second substrate 3 and the second surface 3b of the second substrate 3 are mirror surfaces.

Next, as illustrated in FIG. 8G, while the first surface 2a of the first substrate 2 and the second surface 3b of the second substrate 3 are facing each other, the first surface 2a of the first substrate 2, the second surface 2b of the first substrate 2, and the infrared ray camera 8 used to identify the alignment mark 4 are arranged orthogonally. The transmitted light 7 of infrared rays may be emitted from a first surface 2a side of the first substrate 2 or may be emitted from the second surface 2b side of the first substrate 2. Next, the alignment mark 4 formed on the first substrate 2 is image-identified with the transmitted light 7 of infrared rays emitted from the infrared ray camera 8. In a case of the alignment of the first substrate 2, the contrast of the alignment mark 4 captured by the infrared ray camera 8 is increased; for this reason, it is possible to image-identify the alignment mark 4 with the transmitted light 7 of infrared rays. Therefore, it can be seen that the infrared transmittance of the bottom portion 6 having the characteristic shape by dry etching is lower than the infrared transmittance of the first surface 2a of the first substrate 2. Additionally, it can be seen that it is possible to image-identify the alignment mark 4 with the transmitted light 7 of infrared rays even in a case where the alignment mark 4 is formed on a silicon substrate that transmits infrared rays. Next, the first substrate 2 is aligned based on the alignment mark 4.

Figure 8H:
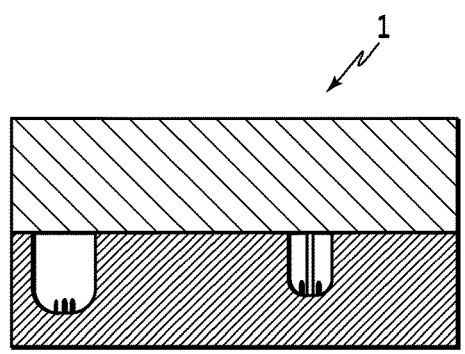
Figure 8F:
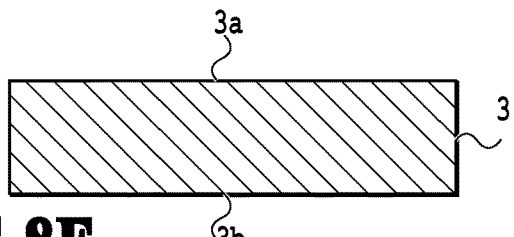

Next, as illustrated in FIG. 8H, after the bonding using an adhesive (not illustrated), the aligned first surface 2a of the first substrate 2 and second surface 3b of the second substrate 3 are cured by thermal processing. Before the alignment of the first substrate 2, the adhesive is spin coated on a dry film to be transferred onto the first surface 2a of the first substrate 2 in advance. In this process, the adhesive is not transferred onto the openings of the alignment mark 4 and the recess portion 5. A method of applying the adhesive may include screen printing and patterning by photolithography using a photosensitive adhesive. As a bonding method, the bonding may be performed by direct bonding such as diffusion bonding without using an adhesive.

As described above, according to the present embodiment, it is possible to manufacture a silicon substrate in which an alignment mark is formed on the substrate itself. With the substrate 1 including an alignment mark that is manufactured as described above, it is possible to align the first substrate 2 by image-identifying the alignment mark 4 with the transmitted light 7 of infrared rays.

<Second Manufacturing Method>

Figure 9:
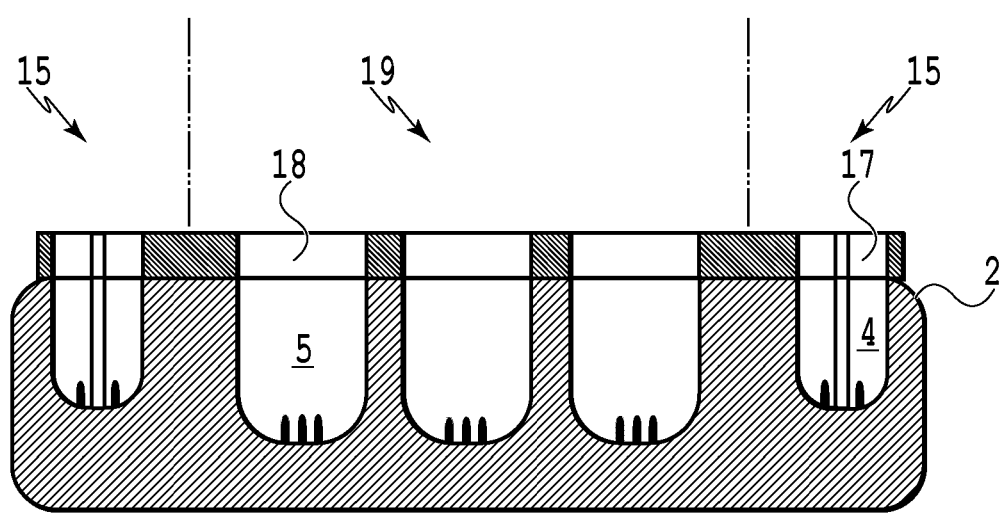
FIG. 9 is a schematic cross-sectional view illustrating a method of manufacturing the substrate.

FIG. 9 is a cross-sectional view illustrating a method of manufacturing the first substrate 2 illustrated in FIG. 4. In other words, FIG. 9 is a cross-sectional view of a case of viewing the first substrate 2 illustrated in FIG. 4 from the same direction as FIG. 1. In a second manufacturing method, there is described an example where the first substrate 2 including the alignment mark is manufactured by a method different from the first manufacturing method.

The above-described first manufacturing method illustrated in FIG. 8D differs from the second manufacturing method. Therefore, only a part corresponding to FIG. 8D is described below.

As illustrated in FIG. 9, the alignment mark 4 and the recess portion 5 are formed on the first substrate 2 concurrently by the Bosch process using reactive ion etching, which is a kind of dry etching.

In order to etch the alignment mark 4 and the recess portion 5, $SF_6$ gas is used. In order to form the protective film on the side surfaces of the alignment mark 4 and the recess portion 5, $C_4F_8$ gas is used. In this process, the micro-loading effect can be expected by forming the alignment mark 4 in the region 15 of low plasma density in the first surface 2a of the first substrate 2 and forming the recess portion 5 in the region 19 of high plasma density in the first surface 2a of the first substrate 2. In other words, it is possible to form the alignment mark 4 at a shallower position than the recess portion 5. The depth of the formed alignment mark 4 is about 360 µm, and the depth of the formed recess portion 5 is about 600 µm. The following descriptions are omitted since the details are similar to that of FIGS. 8E to 8H.

With the substrate 1 including an alignment mark that is manufactured as described above, it is also possible to align the first substrate 2 by image-identifying the alignment mark 4 with the transmitted light 7 of infrared rays.

OTHER EMBODIMENTS

It is possible to combine the above-described embodiments as needed. For example, it is possible to form the alignment mark 4 at a shallower portion of the substrate 2 by forming the alignment mark 4 surrounded by the groove portion 11 in a frame shape that is described with reference to FIGS. 6 and 7 as the aggregate of the multiple holes 9 as described in FIG. 3B.

In addition, for example, it is also possible to combine the modes described in FIGS. 3C and 3D. It is possible to form the alignment mark 4 at a shallower portion of the substrate 2 by forming the alignment mark 4 as the aggregate of the multiple holes 9 and the linear opening portion 10 at a position close to the recess portion 5. Moreover, the other above-described embodiments may be combined as needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2021-114950, filed Jul. 12, 2021, and No. 2022-094250, filed Jun. 10, 2022 which are hereby incorporated by reference wherein in their entirety.

What is claimed is:

1. A method of manufacturing a substrate, comprising:
preparing a first silicon substrate including a first surface and a second surface, the second surface being a surface that is an opposite of the first surface;
forming a resist layer on the first surface of the first silicon substrate;
forming a pattern for processing an alignment mark and a pattern for processing a recess portion in the resist layer;
forming, in the first silicon substrate, the alignment mark and the recess portion by concurrently dry etching the resist layer in which the pattern for processing the alignment mark and the pattern for processing the recess portion have been formed, the alignment mark not penetrating the first silicon substrate and including a bottom portion with a lower infrared transmittance than that of the first surface and the second surface;
removing the resist layer from the first silicon substrate;
preparing a second silicon substrate; and
aligning the first silicon substrate and the second silicon substrate by disposing the second silicon substrate on a side facing the first surface of the first silicon substrate, by orthogonally arranging predetermined positions of the first surface and the second surface of the first silicon substrate in a horizontal direction and an infrared ray camera and by image-identifying the alignment mark formed on the first silicon substrate with transmitted light of infrared rays emitted from the infrared ray camera,
wherein an opening width of the alignment mark is narrower than an opening width of the recess portion, and
wherein, in the first silicon substrate, a first silicon layer, an oxidized layer, and a second silicon layer are laminated in an order from the first surface toward the second surface, and the recess portion is formed in such a way as to penetrate from the first surface toward the second surface of the first silicon substrate.

2. The method according to claim 1, wherein the predetermined positions are positions in which the alignment mark formed on the first silicon substrate can be image-identified by the transmitted light emitted from the infrared ray camera.

3. The method according to claim 1, wherein in the forming, the alignment mark is formed in a region of low plasma density in the first silicon substrate.

4. The method according to claim 1, wherein in the forming, the alignment mark is formed at a position close to the recess portion.

5. The method according to claim 1, wherein in the forming, a groove portion in a frame shape is formed to surround the alignment mark.

6. The method according to claim 1, wherein in the forming, the alignment mark is formed of a plurality of holes that do not penetrate the first silicon substrate.

7. The method according to claim 6, wherein in an aggregate of the plurality of holes, an aggregate portion including nearest adjacent holes is a mark aggregate, a hole on an outermost side in the mark aggregate is an outermost side hole, and a side arranged on the outermost side of the mark aggregate in the outermost side hole is an outermost side-side, and
wherein a closed curve including the mark aggregate and also including a plurality of outermost side-sides is aligned as a part of an identification shape of the alignment mark.

8. The method according to claim 6, wherein in an aggregate of the plurality of holes, an aggregate portion including the nearest adjacent holes is a mark aggregate, and for the mark aggregate, an alignment mark observation optical system is set such that image contrast corresponding to a portion between adjacent holes in an optical image of the alignment mark is out of a range of the alignment mark and is also darker than a background portion including no structure.

9. The method according to claim 1, further comprising:
  after the aligning, bonding together the first silicon substrate and the second silicon substrate.

10. The method according to claim 1, wherein the dry etching is a Bosch process using reactive etching.

11. The method according to claim 1, wherein a plurality of recess portions, each being the recess portion, are provided in the first silicon substrate.

12. The method according to claim 1, wherein the bottom portion of the alignment mark includes a curved surface.

13. The method according to claim 12, wherein when an opening width of the alignment mark is defined as a chord length, the curved surface has a sagitta that is six percent or more of the chord length.

* * * * *